United States Patent [19]

Morris et al.

[11] Patent Number: 4,680,471
[45] Date of Patent: Jul. 14, 1987

[54] INTEGRATED CIRCUIT PACKAGING

[75] Inventors: Steven L. Morris; Gary C. Lewis, both of Austin, Tex.

[73] Assignee: Motorola, Inc., Schaumburg, Ill.

[21] Appl. No.: 713,922

[22] Filed: Mar. 20, 1985

[51] Int. Cl.⁴ .............................................. G01T 1/22
[52] U.S. Cl. .................................... 250/370; 356/29; 250/388
[58] Field of Search .......... 250/370 R, 370 A, 370 F, 250/370 H, 370 K, 388, 370 D; 357/29, 40, 58, 74, 84

[56] References Cited

U.S. PATENT DOCUMENTS 3,609,478  9/1971  King et al. ............................ 357/29
4,423,548  1/1984  Hulseweh ............................. 357/29

FOREIGN PATENT DOCUMENTS 2080026  1/1982  United Kingdom .................. 357/29

Primary Examiner—Janice A. Howell
Attorney, Agent, or Firm—John A. Fisher; Jeffrey Van Myers; David L. Mossman

[57] ABSTRACT

An integrated circuit comprising: a semiconductor die having an integrated circuit formed therein; a package for supporting the die and for providing electrical contact thereto, the radiation properties of the package having been characterized as follows: fabricating a detector using a semiconductor fabrication technique, the detector having substantially the same dimensions as an integrated circuit to be packaged in the packaging material; packaging the detector using integrated circuit packaging techniques; and measuring the radiation environment of the detector.

9 Claims, 2 Drawing Figures

INTEGRATED CIRCUIT PACKAGING

FIELD OF THE INVENTION

This invention relates to integrated circuits, and, more specifically to packaging and packaging materials for integrated circuits.

BACKGROUND OF THE INVENTION

Certain integrated circuits, particularly high density dynamic random access memory devices, are sensitive to alpha particle radiation. In such devices, the necessarily small size of the storage capacitors in each cell allows the data stored therein to be destroyed if struck by an alpha particle.

Alpha particles travel relatively slowly, and are stopped rather easily, so an integrated circuit within a package, which may be plastic or ceramic or another material, generally is unaffected by alpha particles in the ambient. The package material itself, however, is a substantial source of such particles, particularly if the package is of ceramic. Ceramic packages are usually Alumina of high purity. Even high purity Alumina, however, contains a certain amount of thorium and uranium which are emitters of alpha particles.

Before a material can be accepted as a memory packaging material, the material must be characterized with respect to its alpha particle emissions to determine whether the radiation is sufficiently low to provide an acceptable package. Presently, materials are tested in several ways: a large number of memory devices are packaged with the material and placed on operating test to determine the average soft-failure rate, or gas proportional detectors are used to monitor the material before molding. The number of required parts and the complexity of the test make the operating test method undesirable, and leaves open the possibility of confusing other soft-error types with alpha particle hits. The gas proportional test method does not accurately reflect the environment in which the device will operate.

It is an object of this invention to provide a new test method and procedure for characterizing integrated circuit packaging materials.

It is a further object of the invention to provide a method of packaging integrated circuits in a material characterized by the method.

It is a still further object of the invention to provide an integrated circuit packaged in the material.

SUMMARY OF THE INVENTION

The foregoing objects are accomplished by providing an integrated circuit comprising: a semiconductor die having an integrated circuit formed therein; a package for supporting the die and for providing electrical contact thereto, the radiation properties of the package having been characterized as follows: fabricating a detector using a semiconductor fabrication technique, the detector having dimensions representative of the dimensions of an integrated circuit to be packaged in the packaging material; packaging the detector using integrated circuit packaging techniques; and measuring the radiation environment of the detector.

DESCRIPTION OF A PREFERRED EMBODIMENT

As previously noted, the testing and evaluation of packages and packaging materials has suffered from complexity in the case of operating test and from failure to accurately reflect the environment in the case of tests using the gas proportional method.

To overcome the above limitations, it is proposed to provide a detector of a dimension such that the detector can be placed within the package itself in order to measure the actual energy spectrum which will be experienced by an actual packaged integrated circuit.

In a preferred embodiment, a semiconductor wafer is processed using conventional processing techniques to produce a plurality of PIN diode devices of a desired dimension. The semiconductor wafer is then sawed or otherwise cut into individual dice each die representing one PIN diode. A PIN diode is a known sensor of alpha particles, and is essentially a diode with an intrinsic layer between the P and N materials of the diode. Other suitable detectors may also be used.

Figure 1:
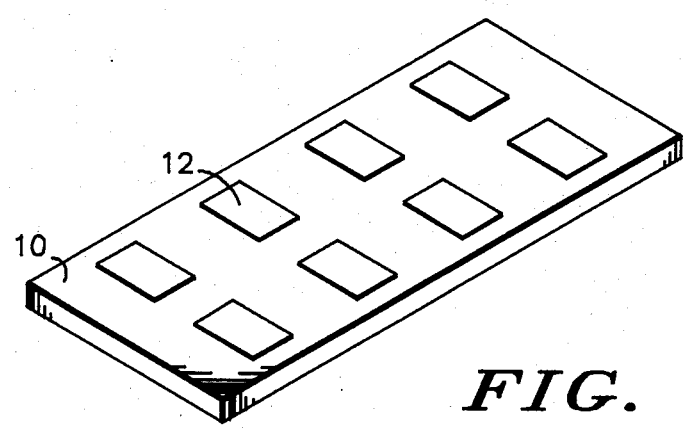
FIG. 1 is a representation of a semiconductor die processed to form a PIN diode

As shown in FIG. 1 each of the dice has surface 10 on which the intrinsic layer and the semiconductive layers have been formed. Also formed on surface 10 are a plurality of bonding pads 12 similar to those conventionally found on an integrated circuit device for electrically connecting the integrated circuit to the leads or pins of the package. Each die is of a size that can be packaged in the cavity of, for example, a ceramic integrated circuit package or be attached to a lead frame and encapsulated within a plastic package or any other type of package.

Figure 2:
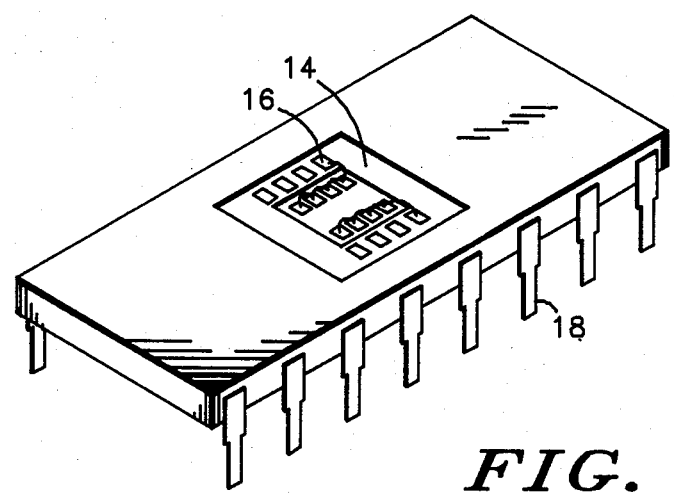
FIG. 2 is an integrated circuit package with a detector therein, in accordance with the invention.

As shown in FIG. 2, the PIN diode is placed inside the die mounting cavity 14 of a semiconductor package. While FIG. 2 shows a representation of a ceramic dual inline package, other package types may be used. The bonding pads of the receptor are bonded to connections 16 to the leads 18 of the package. Since only the substrate and one other connection to the diode are required, several of the bonding pads on the diode may simply be connected together.

In operation, a reverse bias voltage is applied to the diode through the connections to the package pins or leads. Each time an alpha particle strikes the surface of the diode, a pulse discharge is precipitated. The frequency and number of these pulses can be accurately measured by known measurement techniques.

In one embodiment, the PIN diode die is sized identically to the integrated circuit device which will ultimately occupy the packages of the type under test. This has the advantage that the test device will see an energy spectrum identical to that which the integrated circuit itself will eventually see. Depending on the relative sensitivity of the integrated circuit and the test diode, which can be determined experimentally, a scaling factor can be derived to provide a representation of the potential soft error rate, for example, of an integrated circuit DRAM to be packaged in a package of the type under test.

In another embodiment, one or more detectors may be packaged within the test package in an arrangement whereby the diodes are sized to represent only selected portions of the integrated circuit which may be most subject to reliability problems in the actual integrated circuit. In the case of a package to be used in packaging DRAMs, for example, the diode or other receptor may be sized to the dimension of the cell array of the memory rather than the size of the entire memory chip, since the array is the most sensitive portion of the circuit. This would allow also the collection of empirical data relating a certain energy level or spectrum with actual failures in memory devices subsequently tested.

Other receptor sizes may also be used. Since in a DRAM the capacitor of each cell is primarily sensitive to alpha particle hits, the receptor may be sized to represent an area equivalent to the collective area of all the capacitors in the actual memory device to be packaged in the package type under test.

We claim:

1. A method for fabricating an integrated circuit comprising:
   fabricating a semiconductor die having an integrated circuit formed therein:
   assembling the die into a package of a packaging material, the radiation properties of which have been characterized as follows:
   fabricating a means for detecting radiation using a semiconductor fabrication technique;
   packaging the means for detecting radiation into said package of said packaging material using integrated circuit packaging techniques; and
   measuring the radiation emitted by said package of the packaging material by said means for detecting radiation within the package.

2. A method as set forth in claim 1 wherein the means for detecting radiation has substantially the same dimensions as an integrated circuit to be packaged in the package of the packaging material.

3. A method as set forth in claim 1 wherein the means for detecting radiation has substantially the same dimensions as a critical portion of an integrated circuit to be packaged in the package of the packaging material.

4. A method as set forth in claim 1 wherein the dimensions of the means for detecting radiation are proportional to a critical portion of an integrated circuit to be packaged in the package of the packaging material.

5. An integrated circuit comprising:
   a semiconductor die having an integrated circuit formed therein;
   a package of a packaging material for supporting the die and for providing electrical contact thereto, the radiation properties of the package having been characterized as follows:
   fabricating a means for detecting radiation using a semiconductor fabrication technique;
   packaging the means for detecting radiation in said package of said packaging material; and
   measuring the radiation emitted by said package of the packaging material by said means for detecting radiation within the package.

6. A circuit as set forth in claim 5 wherein the means for detecting radiation has substantially the same dimensions as an integrated circuit to be packaged in said package of the packaging material.

7. A circuit as set forth in claim 5 wherein the means for detecting radiation has substantially the same dimensions as a critical portion of an integrated circuit to be packaged in said package of the packaging material.

8. A circuit as set forth in claim 5 wherein the dimensions of the means for detecting radiation are proportional to a critical portion of an integrated circuit to be packaged in said package of the packaging material.

9. A method for determining the radiation properties of an integrated circuit package comprising:
   fabricating a means for detecting radiation using a semiconductor fabrication technique;
   packaging the means for detecting radiation in said package; and
   measuring the radiation emitted by said package of the packaging material by said means for detecting radiation within the package.

* * * * *